(12) United States Patent
Ball et al.

(10) Patent No.: US 7,346,903 B2
(45) Date of Patent: Mar. 18, 2008

(54) COMPILING AND LINKING MODULES OF A CYCLE-BASED LOGIC DESIGN

(75) Inventors: Michael S. Ball, La Mesa, CA (US); Cristina N. Cifuentes, Atherton, CA (US); David S. Allison, San Ramon, CA (US); Liang T. Chen, Saratoga, CA (US); Ankur Narang, New Delhi (IN)

(73) Assignee: Sun Microsystems, Inc., Santa Clara, CA (US)

( * ) Notice: Subject to any disclaimer, the term of this patent is extended or adjusted under 35 U.S.C. 154(b) by 760 days.

(21) Appl. No.: 10/357,782

(22) Filed: Feb. 4, 2003

(65) Prior Publication Data

US 2004/0154002 A1 Aug. 5, 2004

(51) Int. Cl.
*G06F 9/44* (2006.01)

(52) U.S. Cl. .................... 717/162; 719/331; 703/13

(58) Field of Classification Search .............. 717/162, 717/140; 719/331; 712/17; 703/13
See application file for complete search history.

(56) References Cited

U.S. PATENT DOCUMENTS

| | | | | |
|---|---|---|---|---|
| 5,062,039 A | * | 10/1991 | Brown et al. ............... 717/162 |
| 5,519,866 A | * | 5/1996 | Lawrence et al. .......... 717/162 |
| 5,784,593 A | * | 7/1998 | Tseng et al. .................. 703/15 |
| 5,809,283 A | * | 9/1998 | Vaidyanathan et al. ....... 703/16 |
| 5,907,698 A | * | 5/1999 | Kucukcakar et al. .......... 716/6 |
| 5,960,171 A | * | 9/1999 | Rotman et al. .............. 714/49 |
| 6,182,258 B1 | * | 1/2001 | Hollander .................. 714/739 |
| 6,347,388 B1 | * | 2/2002 | Hollander .................. 714/739 |
| 6,530,054 B2 | * | 3/2003 | Hollander .................. 714/739 |
| 6,993,469 B1 | * | 1/2006 | Bortfeld ...................... 703/15 |
| 7,020,722 B2 | * | 3/2006 | Sivier et al. ................ 709/248 |
| 7,036,114 B2 | * | 4/2006 | McWilliams et al. ....... 717/149 |
| 7,050,958 B1 | * | 5/2006 | Bortfeld et al. .............. 703/15 |
| 7,089,135 B2 | * | 8/2006 | Rajsuman et al. .......... 702/117 |
| 7,137,083 B2 | * | 11/2006 | Hildebrant ..................... 716/4 |
| 7,178,115 B2 | * | 2/2007 | Rajsuman et al. ............. 716/4 |
| 7,231,338 B2 | * | 6/2007 | Cavanagh et al. ............ 703/16 |

OTHER PUBLICATIONS

Proof Linking: an Architecture for Modular Verification of Dynalically Linked Mobile Code, Phillip W. L. Fong et al, ACM, 1998, pp. 222-230.*
Proof Linking: Modular Verification of Mobile Programs in the Presence of Lazy, Dynamic Linking, Philip W. L. Fong et al, ACM, 2001, pp. 379-409.*
IONA Offers Integrated Product Linking Diverse Software Systems, Irish Times, p. 17, Dec. 10, 1997.*
Distributed Interactive Simulation (DIS) James Hardt et al, Fall 1998, 14 pages.*

(Continued)

*Primary Examiner*—Todd Ingberg
(74) *Attorney, Agent, or Firm*—Osha Liang LLP

(57) ABSTRACT

A method for compiling a logic design includes inputting a logic design and an input file into a plurality of compilers, respectively, where the logic design comprises a plurality of modules, compiling separately the plurality of modules into a plurality of object files, and linking the plurality of object files to execute the logic design.

24 Claims, 9 Drawing Sheets

OTHER PUBLICATIONS

Introduction to Military training Simulations: A Guide for Discreet Event Simulationists, Ernest H. Page et al, 1998, pp. 53-60.*

The Department of Defense High Level Architecture, Judith S. Dahmann et al, 1997, 9 pages.*

Defense Modeling and Simulation Office M&S Data Engineering Technical Framework, DMSO-DE-97-0002, 2.0 Feb. 13, 1997, 28 pages.*

Linkers & Loaders, John R. Levine, Oct. 1999, pp. 5-9, 47-49, 205-213.*

"Efficient Circuit Partitioning to Extend Cycle Simulation Beyond Synchronous Circuits", Charles J. DeVane et al, IEEE, 1997, 8 pages.*

Implementation of a Cycle-Based Simulator For The Design of a Processor Core, Moon Gyung Kim, et al., IEEE, 1999, pp. 108-111.*

HDL Chip Design, Douglas J. Smith, Doone Publications, Jul. 2001, Chapters 1, 3 and pp. 75 and 179.*

* cited by examiner

COMPILING AND LINKING MODULES OF A CYCLE-BASED LOGIC DESIGN

BACKGROUND OF INVENTION

Modern high performance microprocessors have an ever-increasing number of circuit elements and an ever-rising clock frequency. Also, as the number of circuits that can be used in a central processing unit (CPU) has increased, the number of parallel operations has risen. Examples of efforts to create more parallel operations include increased pipeline depth and an increase in the number of functional units in super-scalar and very-long-instruction-word architectures. As CPU performance continues to increase, the result has been a larger number of circuits switching at faster rates. Thus, from a design perspective, important considerations such as the time needed to complete a simulation and the time needed to compile a CPU design is taken into account.

As a result, high performance, massively parallel processed environments are used to perform CPU design simulation. FIG. 1 shows a block diagram of a typical computer system (100) used to control and monitor execution of a CPU design simulation. A host computer (114), with associated data store (105), controls the simulation of the CPU design that executes on a simulation hardware (116).

The host computer (114) includes such hardware and software mechanisms as are needed to manage simulation, e.g., loading execution processor code onto a processor array, transferring test interface files, transferring design symbol files, etc. The data store (105) may contain several kinds of data including hardware definition source code files, clock file data, test interface files, programmable input files, circuit "object" files, design symbol information (or design database), etc. A general purpose computer (112) with a human interface (110), such as a GUI or a command line interface, together with the host computer (114) support common functions of the simulation environment. A simulation control program (118) executes on the host computer (114) and interacts with the simulation hardware (116) via a test interface (120). The test interface (120) facilitates data transfer between the host computer (114) and the simulation hardware (116).

The simulation control program (118) controls and monitors simulations executing on the simulation hardware (116). The simulation control program (118) also allows a user to interact with the simulation (and the simulation hardware (116)) between complete simulation cycles. The simulation control program (118) supports important functions of the simulation environment (100). These functions include interactive display and modification of the simulation state, setting of execution breakpoints based on simulation times and states, use of test vector files and trace files, use of hardware definition language (HDL) modules that execute on the host computer (114). The functions are called from the simulation hardware (116), check pointing and restoration of running simulations, the generation of value change dump (VCD) files compatible with waveform analysis tools, and tracing the origin of bad signal states using backtracking techniques.

The test interface (120) supports the visibility into simulations running on the simulation hardware (116) by applying user-defined input stimuli to selected nodes in the running simulation. The output of the user-defined stimuli may be recorded as a trace of specific signals in the simulation and viewed using post-simulation analysis programs. Alternatively, the output of the user-defined stimuli may be compared to expected output values for signals in the design.

Prior to executing on the simulation hardware (116), the logic design is verified for accuracy and then compiled. During compilation, the compiler decomposes a logic design into execution processor code that may be executed in parallel on a processor array of the simulation hardware (116) by one or more execution processors. The compiler also produces routing tables and other information, such as routing processor code, control code and a design symbol file. The design symbol file involves recording physical locations where the values of nets and registers have been stored, so that test interface (120) and routines called by the simulation control program (118) may access values of nets and registers.

Compilation as described above may use a single processor compilation system as shown in FIG. 2. FIG. 2 shows a block diagram of a typical compilation system. The compilation system (130) includes compiler (134), an assembler (138), and a linker (142). The compiler (134) receives as input one or more header files (131) and various source code files (132 A, 132 B). The input files are decomposed by the compiler (134) into an assembly code (136). The assembler (138) receives as input the assembly code (136) and generates an object code (140). The linker (142) then accepts the object code as input and generates an executable file (144). Compiling the source files together, as shown in FIG. 2, results in compile times that increase substantially as the number of source files increase.

SUMMARY OF INVENTION

In general, one aspect of the invention relates to a compilation system. The compilation system includes a logic design comprising a plurality of modules, a plurality of compilers arranged to accept as input the logic design and an input file and to separately compile the logic design into a plurality of object files, and a linker arranged to link the plurality of object files to execute the logic design.

In general, one aspect of the invention relates to a method for compiling a logic design. The method includes inputting a logic design and an input file into a plurality of compilers, respectively, where the logic design comprises a plurality of modules, compiling separately the plurality of modules into a plurality of object files, and linking the plurality of object files to execute the logic design.

In general, one aspect of the invention relates to an apparatus for compiling a logic design. The apparatus includes means for inputting a logic design and an input file into a plurality of compilers, respectively, where the logic design comprises a plurality of modules, means for compiling separately the plurality of modules into a plurality of object files, and means for linking the plurality of object files to execute the logic design.

Other aspects and advantages of the invention will be apparent from the following description and the appended claims.

DETAILED DESCRIPTION

Figure 1:
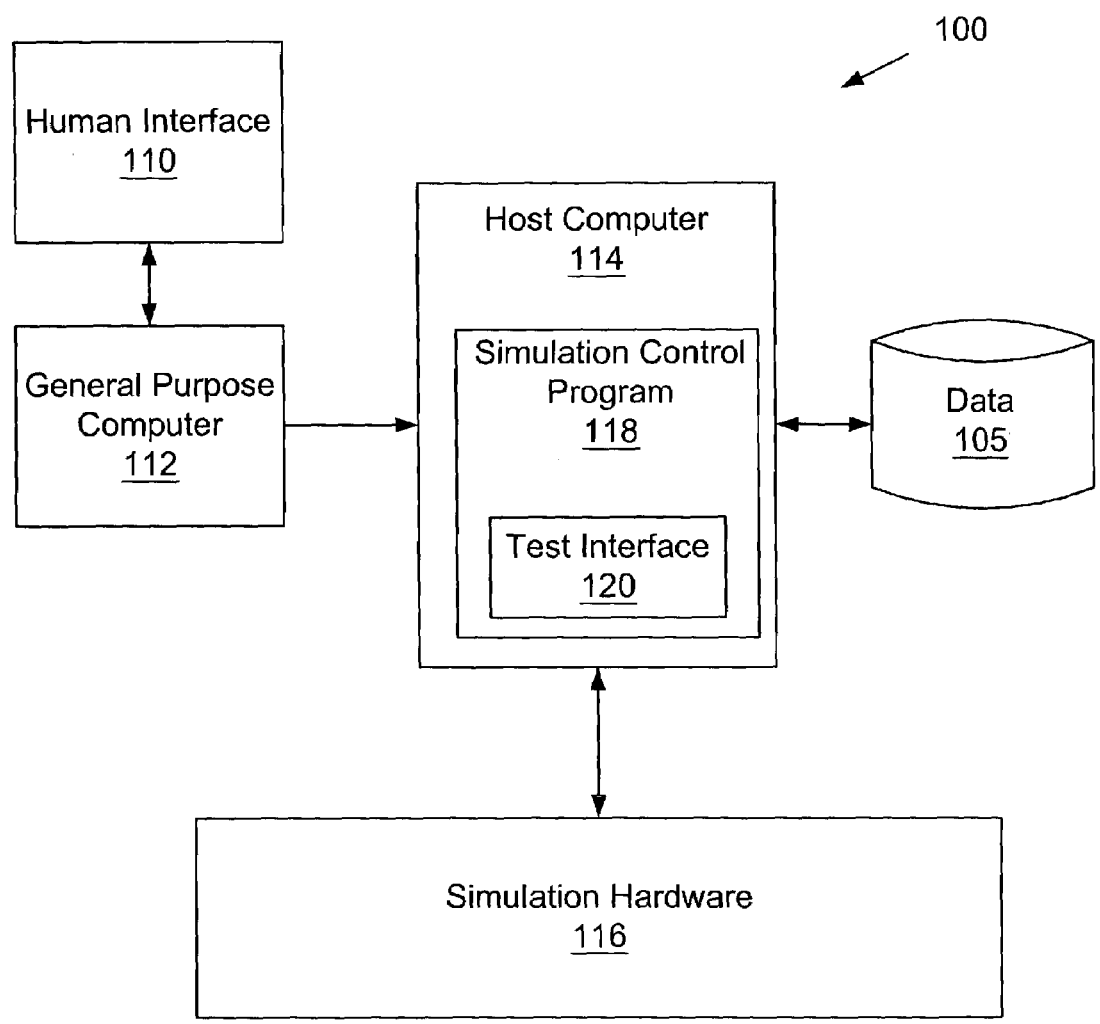
FIG. 1 shows a block diagram of a typical computer system.

Specific embodiments of the present invention will now be described in detail with reference to the accompanying figures. Like elements in the various figures are denoted by like reference numerals for consistency.

The present invention involves a method and apparatus for linking separately compiled simulations in a cycle-based system, e.g., a cycle-based simulation system. In the following detailed description of embodiments of the present invention, numerous specific details are set forth in order to provide a more thorough understanding of the present invention. However, it will be apparent to one of ordinary skill in the art that the present invention may be practiced without these specific details. In other instances, well-known features have not been described in detail to avoid obscuring the present invention. Embodiments of the present invention may be implemented on any type of computer system or processing environment such as those described above in the Background of the Invention.

Before describing in further detail the method and apparatus for linking separately compiled simulations, a computer execution environment and a class of simulation systems (e.g., multiple instruction, multiple data (MIMD)) used with one or more embodiments of the present invention is described below.

In an embodiment of the present invention, the computer execution environment may use execution processors to execute execution processor code on a general purpose computer, such as a SPARC™ workstation produced by Sun Microsystems, Inc., or specialized hardware for performing cycle-based computations.

Those skilled in the art will appreciate that the computer systems described herein are merely exemplary embodiments of the present invention may be implemented on any type of computer system or programming or processing environment.

The specialized hardware is a massively parallel, cycle-based computing system. The system uses an array of execution processors arranged to perform cycle-based computations. One example of cycle-based computation is simulation of a cycle-based design written in a computer readable language, such as HDL (e.g., Verilog, etc.), or a high-level language (e.g., Occam, Modula, C, etc.).

Figure 3:
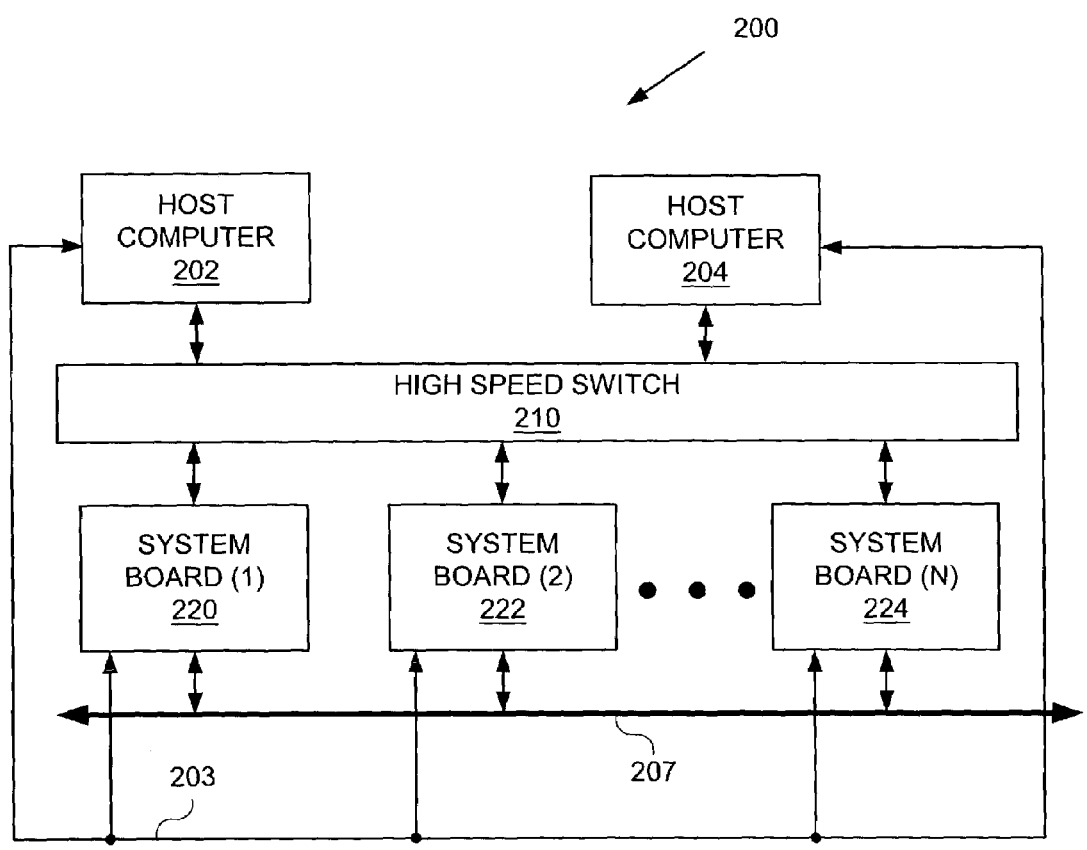
FIG. 3 shows a block diagram of a massively parallel processed system in accordance with one or more embodiments of the present invention.

FIG. 3 shows exemplary elements of a system (200) in accordance with one or more embodiments of the present invention. Cycle-based computation, such as a logic simulation on the system (200), involves one or more host computers (202, 204) managing the logic simulation(s) executing on one or more system boards (220, 222, 224). Each system board contains one or more Application Specific Integrated Circuits (ASIC). Each ASIC contains multiple execution processors. The host computers (202, 204) may communicate with the system boards (220, 222, 224) using one of several pathways. The host computers (202, 204) include interface hardware and software as needed to manage a logic simulation.

A high speed switch (210) connects the host computers (202, 204) to the system boards (220, 222, 224). The high speed switch (210) is used for loading and retrieval of state information from the execution processors located on ASICs on each of the system boards (220, 222, 224). The connection between the host computers (202, 204) and system boards (220, 222, 224) also includes an Ethernet connection (203). The Ethernet connection (203) is used for service functions, such as loading a program and debugging. The system also includes a backplane (207). The backplane (207) allows the ASICs on one system board to communicate with the ASICs of another system board (220, 222, 224) without having to communicate with an embedded controller located on each system board. Additional system boards may be added to the system by connecting more system boards to the backplane (207).

Figure 2:
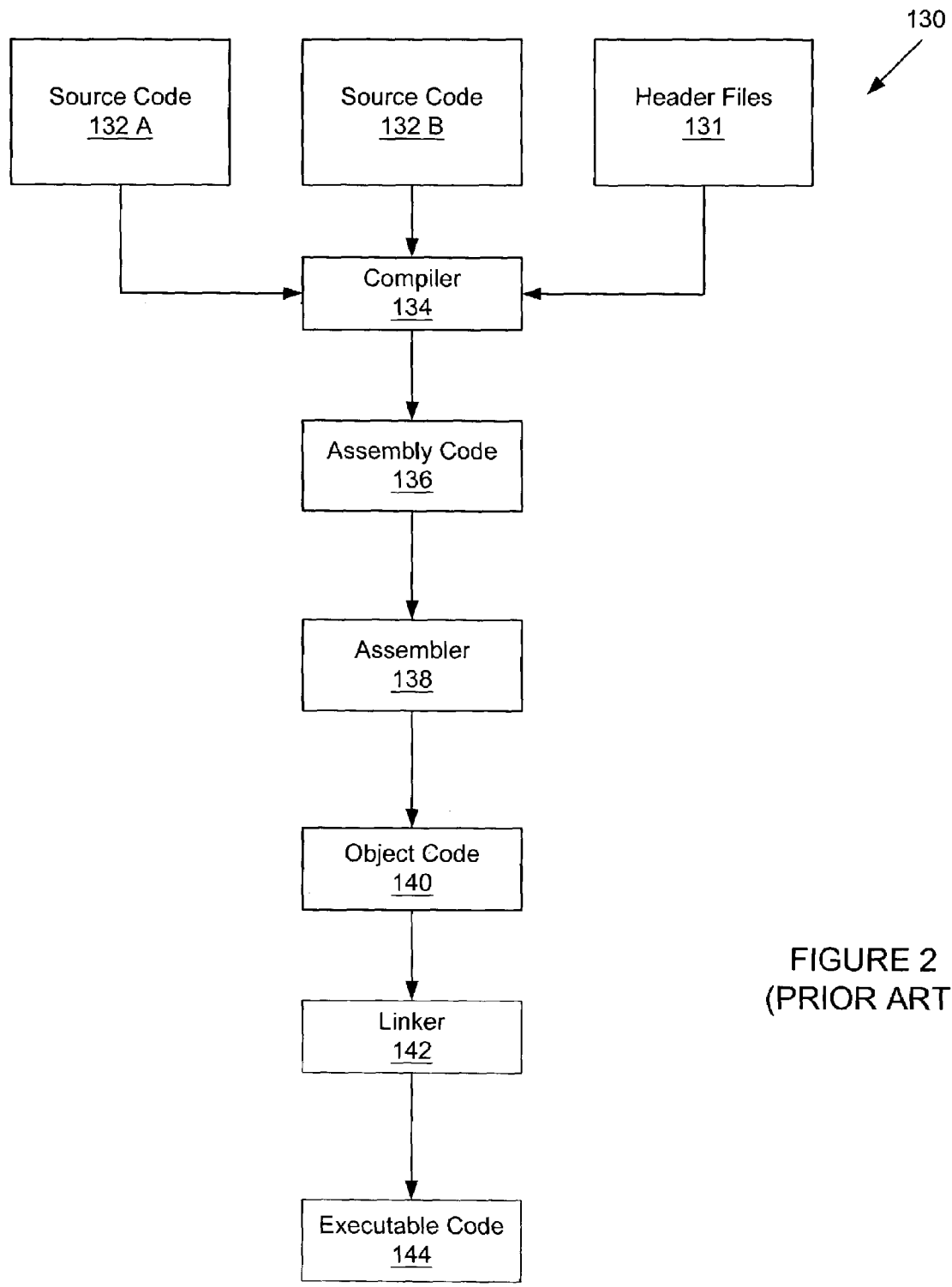
FIG. 2 shows a block diagram of a typical compilation system.
Figure 4:
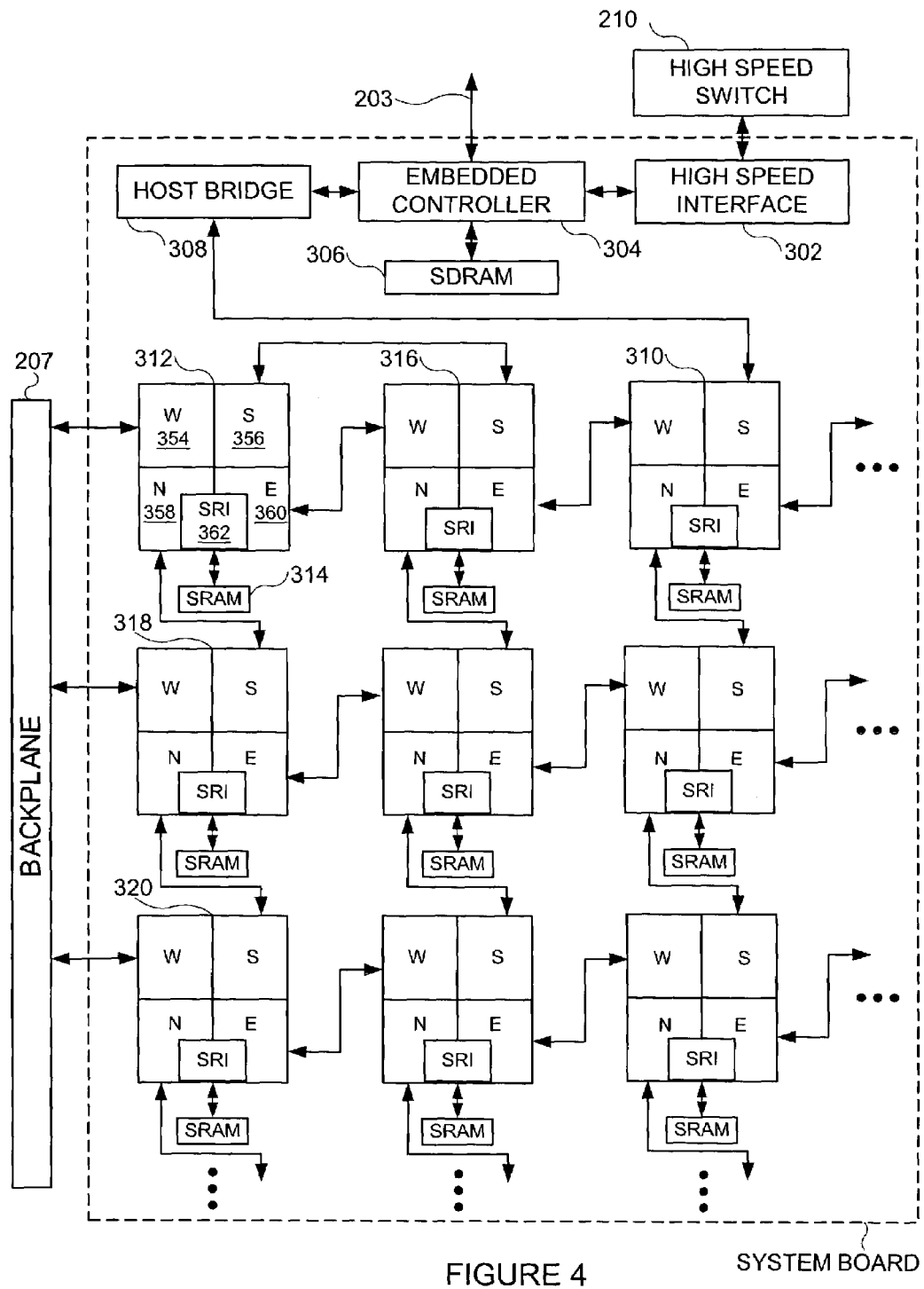
FIG. 4 shows a block diagram of a system board of the system in FIG. 3 in accordance with one or more embodiments of the present invention.

FIG. 4 shows a block diagram of a system board in accordance with one or more embodiments of the present invention. The system board is representative of any of the system boards (e.g., system boards (220, 222, 224)) shown in FIG. 2. The system board may include multiple ASICs (e.g., 312, 316, 310, 318, 320, etc.). Each ASIC is connected via a two-dimensional mesh. Each ASIC has four input/output buffers referenced as North (N), South (S), East (E), and West (W). For example, an ASIC (312) has four input/output buffers N (358), S (356), E (360), and W (354). Each ASIC connects to other ASICs using the four input/output buffers, one for each neighboring ASIC. An edge ASIC may connect to other edge ASIC to create a secondary connection. For example, ASIC (312) and ASIC (316) connect using the E and W input/output buffers, respectively, and using their respective S input/output buffers. Another possible connection for edge ASICs is a connection to the backplane (207), which connects to other system boards. For example, ASICs (312, 318, 320) connect to the backplane, each using their respective W input/output buffers. Each ASIC may also connect to external memory in the form of static random access memory (SRAM) through an SRAM interface. For example, ASIC (312) connects to SRAM (314) through SRI (SRAM interface) (362).

One ASIC on each system board is used as an operative connection to an embedded controller. For example, ASIC (310) uses its S input/output buffer to connect to an embedded controller (304) through a host bridge (308). The embedded controller (304) connects to an Ethernet network (203), associated memory in the form of a synchronous dynamic random access memory (SDRAM) (306), and a high speed switch interface (302). The high speed switch interface (302) connects to the high speed switch (210). The SDRAM (306) may store instructions for the embedded controller (304).

Figure 5:
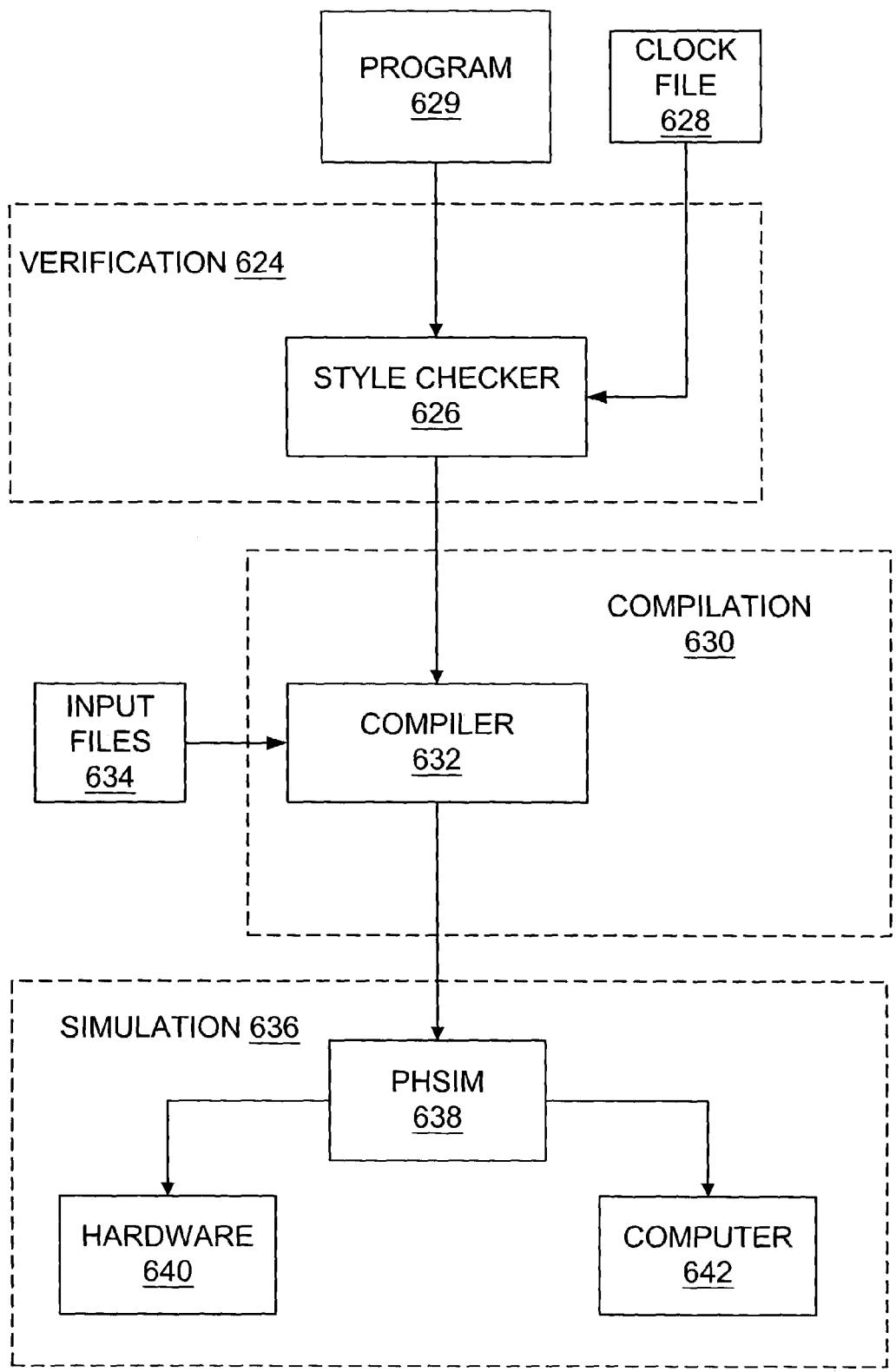
FIG. 5 shows a flow diagram of preparing a simulation of a cycle-based logic design to execute on a cycle-based system in accordance with one or more embodiments of the present invention.

In accordance with one or more embodiments of the present invention, FIG. 5 shows a process of preparing a simulation of a cycle-based logic design to run on a cycle-based system, e.g., the Phaser System. The process includes three separate phases. The first phase is a verification phase (624). This phase includes a style checker (626), which parses and checks high level design code of a program (629) representing the cycle-based design. The program is checked for adherence to a cycle-based design standard, e.g., synchronous logic design, no combinational logic loops are included, etc. An error action during this phase results from nonconformance to the defined cycle-based design standards. A clock file input (628) defines clocks cycles for the simulation. The output of the verification phase (624) produces a verified cycle-based design.

The second phase is a compilation phase (630), which receives the verified cycle-based design as input from the verification phase (624). The compilation phase (630) uses a translation component, such as a compiler (632), to compile the verified cycle-based design of the verification phase (624). The compiler (632) decomposes the verified cycle-based design into execution processor code that may be executed in parallel on a processor array of the cycle-based system by one or more execution processors.

The compiler also produces routing tables and other information, such as routing processor code, interface code, and an annotated symbol table. Routing tables enable static routing of messages sent during execution. An annotation symbol table involves recording physical locations where the values of nets and registers have been stored, so that user interface and Programming Language Interface (PLI) routines may access values of nets and registers during runtime. Input files (634), e.g., PLI and TVI files, etc., provide functionality for items such as system task calls and trace vectors.

Errors in cycle-based designs input into the compiler (632) cause an error action. The compiler and code generation includes a scheme for routing of messages and placement of compiled execution processor code so that there is some optimization in the choice of which of the parallel execution processors of the simulation hardware to use for certain tasks. This is because the time required for delivery of a message from one processor to another depends upon the data connection component between those execution processors, (i.e., the number of hops the message takes in traversing the data connection component from source processor to destination processor). One skilled in the art can appreciate that compilation of a program may be targeted to a specific execution environment and/or platform, e.g., Phaser system hardware or an appropriate computer, such as a SPARC™ workstation produced by Sun Microsystems, Inc.

The third phase is the simulation phase (636), which receives input in the form of execution processor code from the compilation phase (630). A Phaser simulator driver (638) (PHSIM) typically runs on a host computer and controls and monitors execution of simulations executing on the cycle-based system.

The host computer includes such hardware and software mechanisms as are needed to manage simulation, e.g., loading execution processor code onto a processor array. PHSIM (638) enables user interaction with a simulation using a graphical user interface (GUI) or with a command line interface, interactive modification of simulation state, break-pointing, test vector use, system task functionality, signal tracing, single-stepping on clock cycles, and other functionalities. A simulation cycle begins with one or more simultaneous clock edges and completes when every dependent event has completed evaluation. The simulation phase (636) may run on system hardware (640), which is designed for cycle-based computation, or on an appropriate computer, such as a SPARC™ workstation (642) produced by Sun Microsystems, Inc.

The present invention involves a compilation system that enables the linking of separately compiled modules in a massively parallel processor environment. In one embodiment of the present invention, referring to FIG. 5, a verified cycle-based logic design enters the verification phase (624), typically with numerous modules representing various granularity of logic (i.e., top-level modules or sub-modules). These modules may be written in a computer readable language, such as HDL (e.g., Verilog, etc.). In one or more embodiments, the verified logic design may include several top-level modules.

Figure 6:
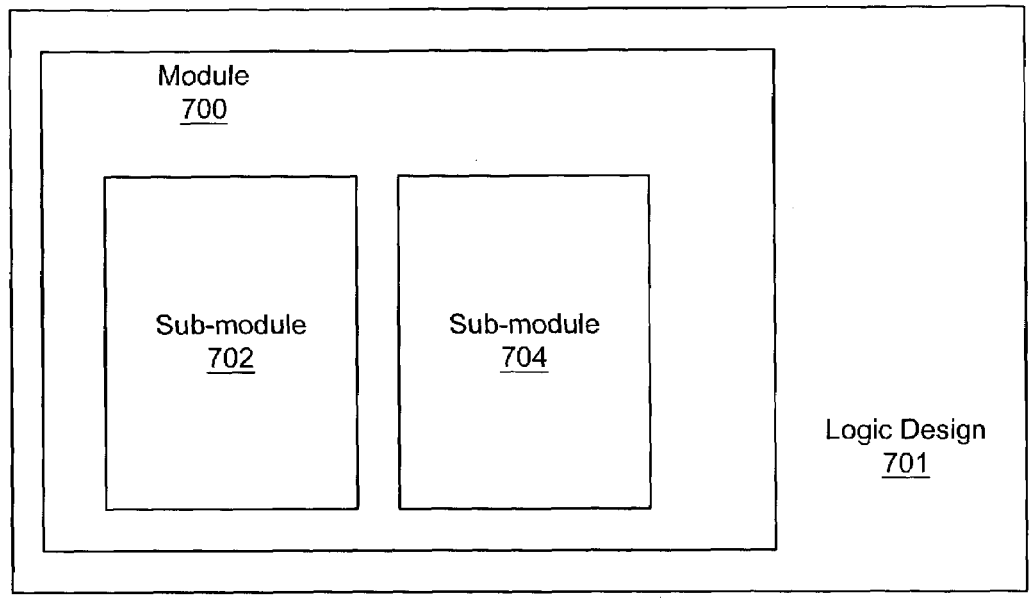
FIG. 6 shows a block diagram of a logic design in accordance with one or more embodiments of the present invention.
Figure 7:
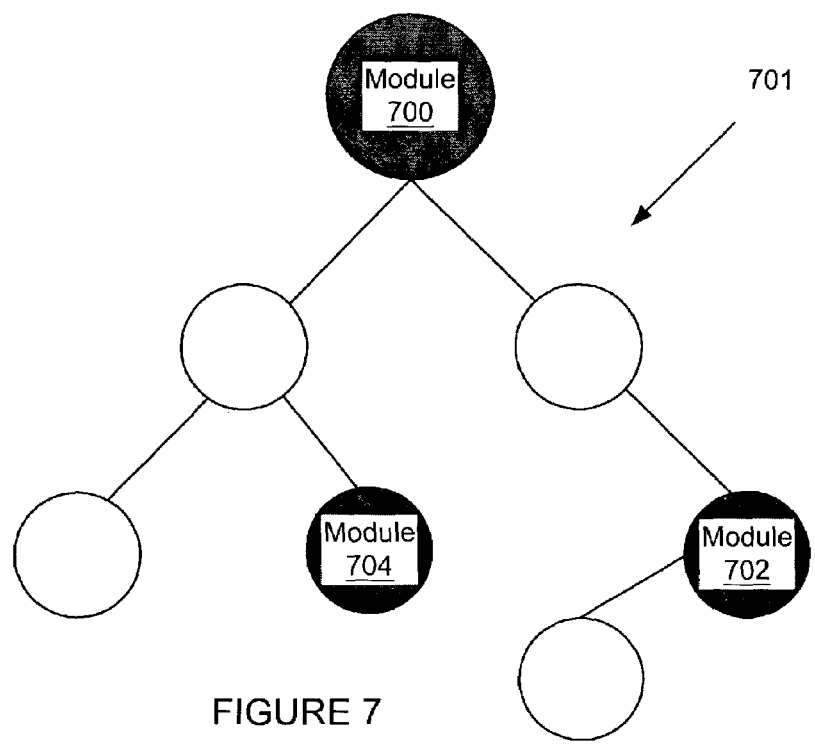
FIG. 7 shows a tree diagram of a logic design in accordance with one or more embodiments of the present invention.

FIG. 6 shows a block diagram of a logic design in accordance with one or more embodiments of the present invention. Likewise, FIG. 7 shows a tree diagram of a logic design in accordance with one or more embodiment of the present invention. Both figures show a logic design (701) that includes a top-level module (700) and sub-modules (702, 704).

After the logic design (701) exits the verification phase in FIG. 5, the modules (700, 702, 704) are compiled. The modules (700, 702, 704) that are compiled define a compilation space (703). At compile time, input files e.g., Verilog parameters, clock file, port description file, etc., associated with the logic design should be specified.

Figure 8:
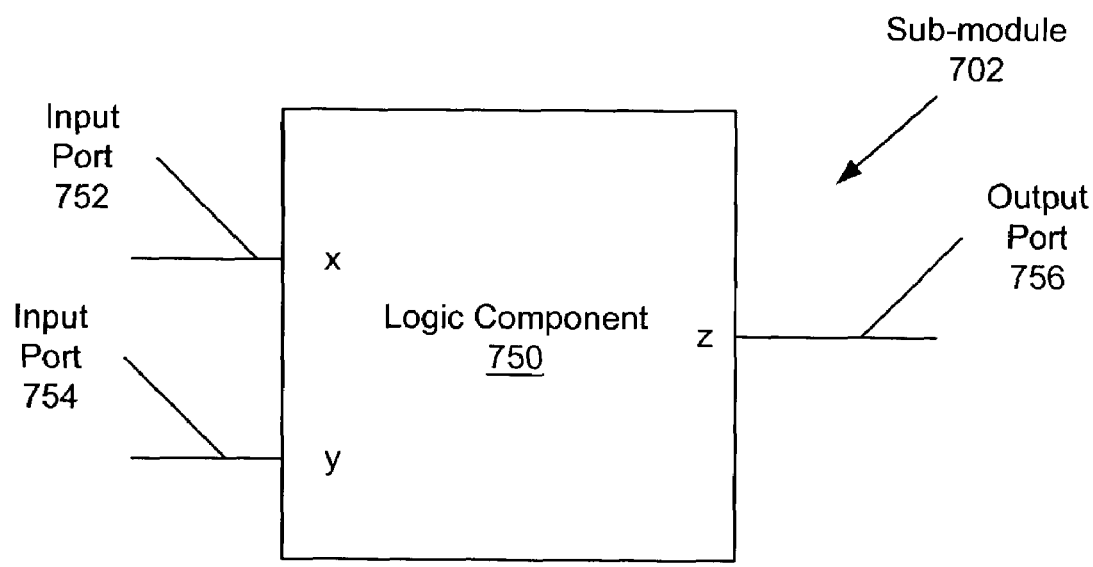
FIG. 8 shows a block diagram of a combinational logic component in accordance with one or more embodiments of the present invention.

In one or more embodiments, a port description file describes the specification of clocking characteristics of the signals within the logic design. FIG. 8 shows a block diagram of a combinational logic component in accordance with one or more embodiments of the present invention. The sub-module (702) represents the combinational logic component (750) with two input ports (752, 754) and one output port (756). The port description file describes characteristics of signals input to ports (752, 754) and output of port (756).

In one or more embodiments, a module (700) may be equivalent to a logic design (701). Alternatively, in one or more embodiments, a module is a subset of a logic design (701). For example, only several top-level modules (i.e., modules with multiple sub-modules) may be independently compiled together or a top-level module may be independently compiled together with several sub-modules. Optionally, only selected modules may be compiled independently. For example, FIGS. 6 and 7 only show modules (700, 702, 704) (shaded circles in FIG. 7), however modules (700, 702, 704) represent only a subset of the logic design (701).

In one or more embodiments, each port is either a clock port or a logical port whose clock phase is specified. Moreover, logical ports may have several communication instructions divided across an execution processor. The logical port may be uni-directional or bi-directional, e.g., in port, out port, in/out port. Additionally, an arbitrary number of entries are also used to describe the physical port; these entries describe the physical communication instructions.

The modules (700, 702, 704) are separately compiled. Separate compilation is a technique that allows parts of a system to be compiled individually into object code and combined later by a linker to create an executable file or execute on the system. In one or more embodiments of the invention, each part of the logic design may be compiled completely independent of all other modules of the logic design.

Figure 9:
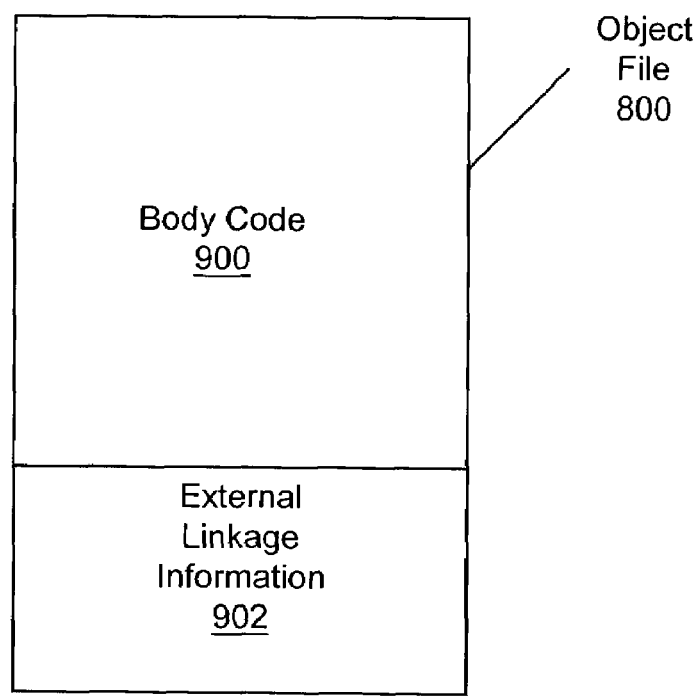
FIG. 9 shows a block diagram of an object file in accordance with one or more embodiment of the present invention.
Figure 10:
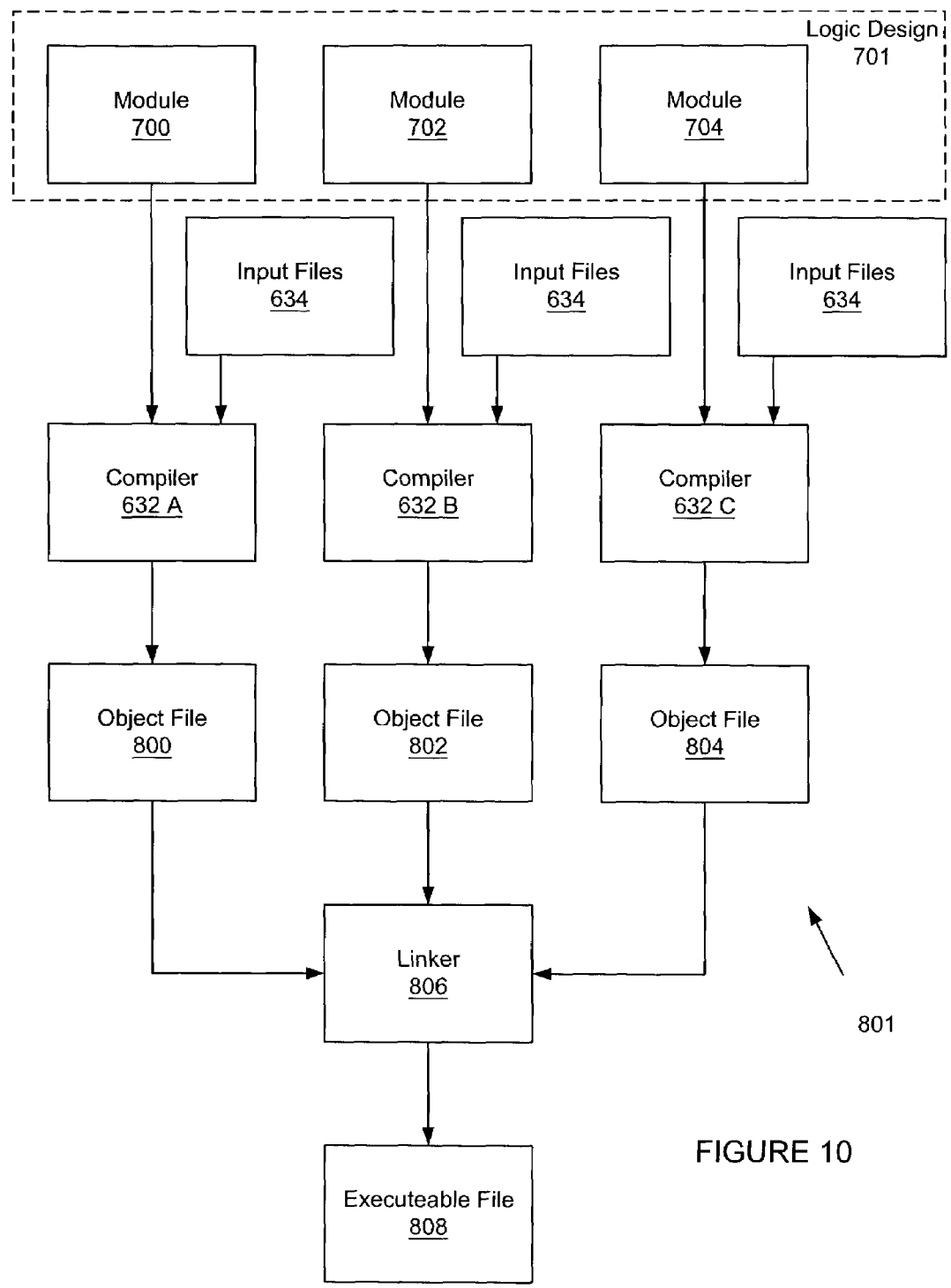
FIG. 10 shows a block diagram of a separate compilation system in accordance with one or more embodiments of the present invention.

FIG. 10 shows a block diagram of a separate compilation system in accordance with one or more embodiments of the present invention. The separate compilation system (801) includes a plurality of instances of a compilers (632 A, 632 B, 632 C) and a linker (806). The modules (700, 702, 704) of the logic design are input to respective compilers (632 A, 632 B, 632 C). In addition to the modules (700, 702, 704), input files (634 in FIG. 9) (e.g., PLI files, TVI files, clock files, port description files, etc.) are also input to the compilers (632 A, 632 B, 632 C). The compilers (632 A, 632 B, 632 C) separately compile the modules (700, 702, 704) to generate object files (800, 802, 804). A linker (806) links the object files (800, 802, 804) to generate an executable file (808) to execute the logic design.

The object files (800, 802, 804) that are produced by the compilers (632 A, 632 B, 632 C) and linked by the linker (806) may be maintained in a particular format. FIG. 9 shows a block diagram of an object file in accordance with one or more embodiments of the present invention. The object file (800, 802, 804) includes a body code section (900) and an external linkage information section (902). The body code section (900) includes the fixed instructions (e.g., execution processor code and routing processor code) used during the computation of the logic design, and the external linkage information section (902) provides information regarding how the module communicates with the other modules in the logic design. The code in the body code section (900) is resolved at compile time, however the code (or data) in the external linkage information section (902) is not.

In one or more embodiments, modules having the same body code sections may be replicated, while the external linkage information section of each module is stored individually. In one or more embodiments, a body code section in an object file may include instructions for execution processors, an index for the execution processors, instructions for routing processors, an index for the routing processors, initial values for registers, an index for initial values of registers, etc. Additionally, in one or more embodiments, an external linkage information section in an object file may include data regarding the external linkage to ports in top-level modules.

Additionally, in one or more embodiments, after linking object code information, the overall structure of the logic design may be encapsulated in an additional section, i.e., module description section. In one or more embodiments, the module description section is used to load the same body of code into more than one execution processor.

One skilled in the art will appreciate that an object file with a body code section and linkage code section may be compiled and linked for any module, i.e., source file, that communicates with other modules via statically scheduled message routing system as described in FIGS. 3-4.

The object files (800, 802, 804) are linked by the linker (806) to execute the logic design (701). In one embodiment, an executable file (808) is created. The executable file (808) may be embodied in variety of data structures, e.g., a hierarchical table, a linked list, an array, etc. In one or more embodiments, a data structure of the executable file lends to execution in a massively parallel processor environment. If external communication is required by a compiled module, the linker may insert a "wait" instruction in the body code section of the executable file (808). Accordingly, during execution, the wait instruction stalls the module until the complete execution of the module from which a computed value is required. In an alternative embodiment, the object files (800, 802, 804) are linked during execution of the logic design. In this case, the individually compiled object files (800, 802, 804) are linked and loaded during execution.

Figure 11:
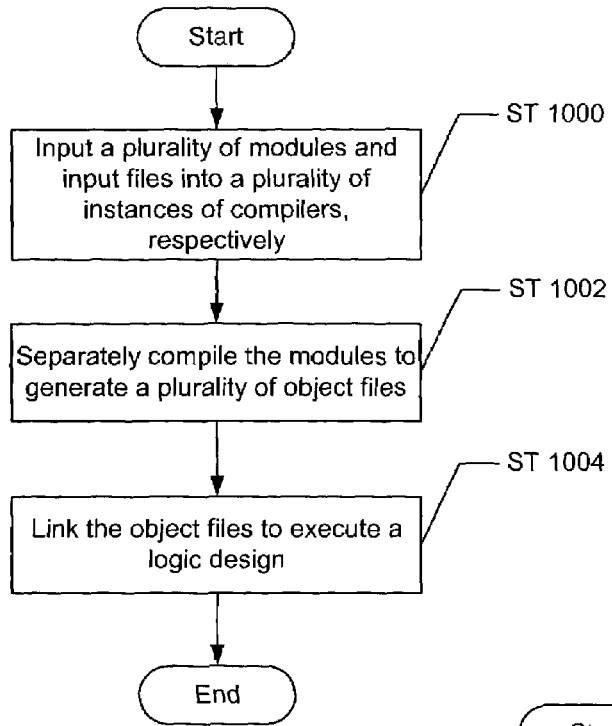
FIG. 11 shows a flow diagram of compiling and linking a logic design in accordance with one or more embodiments of the present invention.

FIG. 11 shows a flow diagram of compiling and linking a compilation space in accordance with one or more embodiments of the invention. Initially, a plurality of modules, i.e., a logic design, and input files are input to a plurality of instances of compilers, respectively (Step 1000). The plurality of modules represent how the functionality of various logic components and how the logic components communicate. In the modules, the communication between logic components is accomplished with statically scheduled messages.

The modules are compiled separately to generate a plurality of object files (Step 1002). The plurality of object files contain two sections: a body code section and an external linkage information section. The body code section includes the functionality and/or data embodied by the logic components. The external linkage information section "houses" the information required for modules to communicate properly. The plurality of object files are linked to execute the logic design (Step 1004). In one or more embodiments, an executable file is generated. The executable file may be modified, for example, by directives or wait instructions being inserted, such that during execution the modules communicate properly. In one or more embodiments, during execution the plurality of object files are linked and loaded. Consequently, an executable file produced by the above-mentioned linking method and apparatus is executed in two portions of a major cycle that is newly calculated.

Figure 12:
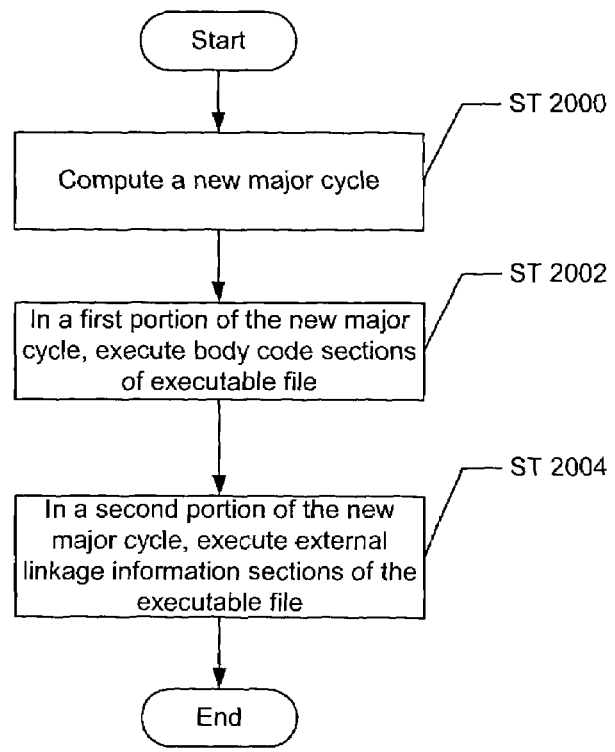
FIG. 12 shows a flow diagram of executing an executable file in accordance with one or more embodiments of the present invention.

FIG. 12 shows a flow diagram of executing an executable file in accordance with one or more embodiments of the present invention. Initially, a new major cycle is calculated by adding a longest cycle produced by a body code section and a cycle produced by an external linkage information section (Step 2000). The external linkage information section is relatively small.

In a first portion (or computation portion) of the new major cycle, the body sections of code of the executable file are executed (Step 2002). The body sections of code are entirely computational and do not require communication with external modules. In a second portion (or linkage portion) of the new major cycle, the external linkage information section is resolved. Meaning, the values input to external modules are resolved (i.e., located in known registers) before the beginning of the cycle and the value output to external modules are resolved at the end of the cycle of the current cycle.

In one or more embodiments of the present invention, the linkage portion is executed after the computation portion, however one skilled in the art will appreciate that the linkage may occur first.

In one or more embodiments of the present invention, linking a plurality of object files requires a portion of code to be relocated. Relocation is achieved using the infrastructure provided by the message routing system. Further, in one embodiment, the relocation may occur at the lowest level of a hardware compute hierarchy, e.g., a processor level. An example of a hardware computer hierarchy (in descending order) includes a system, a board, a chip, a sub-cluster, and a processor. Accordingly, operations, e.g., rotation, translation, mirror image, may result in an optimization of a critical path, thereby minimizing the number of processors used after the linking. The critical path is the longest path of an intermediate form graph derived from a logic design that determines the number of major and minor cycles. One of ordinary skill in the art will appreciate that minimizing relocation of code during linking avoids an expensive routing (and re-routing procedure).

Advantages of embodiments of the present invention may include one or more of the following. In one or more embodiments, the present invention improves the compilation speed. Because modules, i.e., source files, may be compiled separately, compilation time may be decreased. In other words, a compiler is not required to handle multiple source files simultaneously. In some instances, compilation time may be reduced in the order of hours with the present invention. Consequently, there is no need to transmit source trees and elaborate make files and minimal copies of commonly used libraries may be used providing storage savings and easing the distribution of files. Additionally, linking in this manner increases the security, because capturing a logic design from individually compiled object files is substantially more difficult.

In one or more embodiments, the present invention allows for a compilation space that is a subset of a simulation space to be compiled. Advantageously, this allows particular modules to be modified and compiled without necessitating the compilation of an entire simulation space thereby reducing overall compile time.

In one or more embodiments, the present invention allows an object file to be generated having a body code section and an external linkage information section. Accordingly, during execution, instructions within the body code section may be executed in one portion of a major cycle and communication may be executed in a remaining portion of a major cycle thereby effectively reducing input/output communication time. One skilled in the art can appreciate that these portions of a major cycle may overlap during execution.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A compilation system, comprising:
   a cycle-based logic design comprising a plurality of modules, wherein each of the plurality of modules describes a combinational logic component of the cycle-based logic design having an input port and an output port;
   a plurality of compilers configured to generate a plurality of object files by compiling the plurality of modules, wherein each of the plurality of compilers inputs one of the plurality of modules and an input file, wherein at least one of the plurality of object files comprises a body code section and an external linkage information section; and
   a linker that links the plurality of object files into an executable file for simulating the cycle-based logic design, wherein the executable file is stored as a data structure defined for a massively parallel processor environment.

2. The compilation system of claim 1, wherein the body code section comprises fixed instructions used during computation of the cycle-based logic design.

3. The compilation system of claim 1, wherein the external linkage information section comprises information regarding communication between the plurality of modules.

4. The compilation system of claim 3, wherein the communication between the plurality of modules comprises a description of at least one selected from a group consisting of the input port and the output port.

5. The compilation system of claim 1, wherein the input file comprises user defined interface files, test vector files, clock files, and port description files.

6. The compilation system of claim 1, wherein the cycle-based logic design comprises a plurality of top-level modules.

7. The compilation system of claim 1, wherein the cycle-based logic design comprises a top-level module and a plurality of sub-modules.

8. The compilation system of claim 1, wherein the cycle-based logic design comprises a user defined plurality of modules.

9. The compilation system of claim 1, wherein the linker links the plurality of object files during execution.

10. A method for compiling a cycle-based logic design, comprising:
    inputting a plurality of modules of the cycle-based logic design and an input file into a plurality of compilers, wherein each of the pluraliw of modules describes a combinational logic component of the cycle-based logic design having an input port and an output port;
    compiling separately the plurality of modules to generate a plurality of object files, wherein at least one of the plurality of object files comprises a body code section and an external linkage information section; and
    linking the plurality of object files to generate an executable file for simulating the cycle-based logic design, wherein the executable file is stored as a data structure defined for a massively parallel processor environment.

11. The method of claim 10, wherein the body code section comprises fixed instructions used during computation of the cycle-based logic design.

12. The method of claim 11, further comprising: using the fixed instructions during computation of the cycle-based logic design.

13. The method of claim 10, wherein the external linkage information section comprises information regarding communication between the plurality of modules.

14. The method of claim 13, wherein the communication between the plurality of modules comprises at least one selected from a group consisting of the input port and the output port.

15. The method of claim 10, wherein the input file comprises user defined interface files, test vector files, clock files, and port description files.

16. The method of claim 10, wherein the cycle-based logic design comprises a plurality of top-level modules.

17. The method of claim 10, wherein the cycle-based logic design comprises a top-level module and a plurality of sub-modules.

18. The method of claim 10, wherein the cycle-based logic design comprises a user defined plurality of modules.

19. The method of claim 10, wherein the linking occurs during execution.

20. The method of claim 10, further comprising:
    computing a new major cycle using the executable file;
    executing the body code section during a computation portion of the new major cycle; and
    executing the external linkage information section during a linkage portion of the new major cycle.

21. The method of claim 20, wherein the executing the external linkage information occurs before the executing the body code section.

22. The method of claim 20, wherein the executing the external linkage information occurs after the executing the body code section.

23. The method of claim 20, wherein the executing of the external linkage information overlaps the executing the body code section.

24. An apparatus for compiling a cycle-based logic design, comprising:

means for inputting a plurality of modules of the cycle-based logic design and an input file into a plurality of compilers, wherein each of the plurality of modules describes a combinational logic component of the cycle-based logic design having an input port and an output port;

means for compiling separately the plurality of modules to generate a plurality of object files, wherein at least one of the plurality of object files comprises a body code section and an external linkage information section; and means for linking the plurality of object files into an executable file for simulating the cycle-based logic design, wherein the executable file is stored as a data structure defined for a massively parallel processor environment.

* * * * *